United States Patent [19]

Hagiwara

[11] Patent Number: 4,982,160

[45] Date of Patent: Jan. 1, 1991

[54] METHOD AND SYSTEM FOR CONTROLLING MAGNETIC RESONANCE SIGNAL ACQUISITION SEQUENCE

[75] Inventor: Masayuki Hagiwara, Wako, Japan

[73] Assignee: Kabushiki Kaisha Toshiba, Kawasaki, Japan

[21] Appl. No.: 403,869

[22] Filed: Sep. 7, 1989

[30] Foreign Application Priority Data

Sep. 13, 1988 [JP] Japan ................................ 63-229007

[51] Int. Cl.⁵ ............................................. G01R 33/20
[52] U.S. Cl. ..................................... 324/309; 324/307
[58] Field of Search ............... 324/300, 307, 309, 310, 324/311, 312, 313, 314, 318, 322; 128/653

[56] References Cited

U.S. PATENT DOCUMENTS 4,771,242 9/1988 Lampman et al. .................. 324/309

Primary Examiner—Michael J. Tokar
Attorney, Agent, or Firm—Finnegan, Henderson, Farabow, Garrett, and Dunner

[57] ABSTRACT

In one encoding process of MRI, a pulse sequence by a multi-echo method is executed to acquire first and second MR signals of a predetermined slice. A pulse sequence with a shorter echo time is executed by exciting the slice, thus acquiring a third MR signal. In this case, when an echo time and a repetition time are changed, the first MR signal becomes a signal with an emphasized atomic nuclear density, the second MR signal becomes a signal with an emphasized transverse relaxation time T2, and the third MR signal becomes a signal with an emphasized longitudinal relaxation time T1.

7 Claims, 6 Drawing Sheets

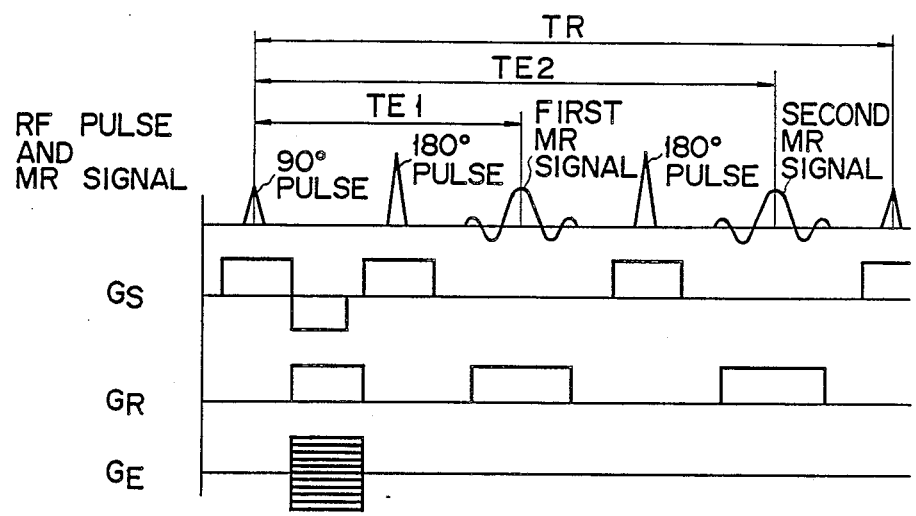
F I G. 1
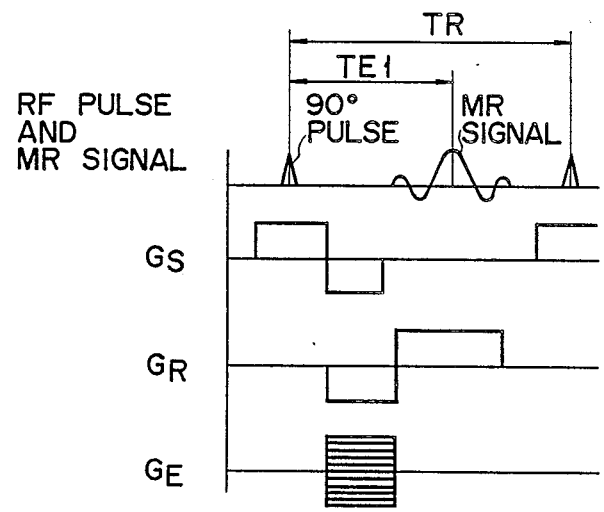
F I G. 2

METHOD AND SYSTEM FOR CONTROLLING MAGNETIC RESONANCE SIGNAL ACQUISITION SEQUENCE

BACKGROUND OF THE INVENTION

1. Field of the Invention

The present invention relates to a method and system for controlling a magnetic resonance signal acquisition sequence.

2. Description of the Related Art

In a conventional medical MRI (magnetic resonance imaging) apparatus, gradient fields and radio frequency (RF) pulses are applied to a subject placed in a static field to occur a magnetic resonance (MR) phenomenon in a specific portion of the patient. An MR signal (echo signal) induced by the MR phenomenon is detected and processed to acquire anatomical data or the like.

Data obtained by the MRI apparatus reflects parameters such as an atomic nuclear density (a hydrogen atomic nuclear density will be referred to as "PD" hereinafter) of the excited specific portion, a longitudinal relaxation time T1, a transverse relaxation time T2, and the like. A conventional pulse sequence used for acquiring MR images having different emphasis for three parameters PD, T1, and T2 will be described below with reference to FIGS. 1 and 2.

FIG. 1 shows a multi-echo signal acquisition pulse sequence using a spin echo (SE) method. With this pulse sequence, MR images in which the hydrogen atomic nuclear density PD and the transverse relaxation time T2 are emphasized can be acquired. More specifically, after excitation of a specific portion of a subject upon application of an RF pulse having a flip angle of 90° (90° pulse or excitation pulse) and a slice gradient field ($G_S$), a spin phase is converged upon application of an RF pulse having a flip angle of 180° (180° pulse or inversion pulse). After the lapse of a predetermined echo time TE1 from the application of the 90° pulse, a first MR signal is acquired. After acquisition of the first MR signal, 180° pulses are sequentially applied to converge the spin phase, thus acquiring a second MR signal, a third MR signal, and so on.

In this pulse sequence, when the echo time TE1 is set to be shorter than a normal time, a first MR signal with the emphasized hydrogen atomic nuclear density PD can be obtained. When an echo time TE2 is set to be longer than a normal time, a second MR signal with the emphasized transverse relaxation time T2 can be obtained. The echo time TE2 corresponds to an integer multiple of the echo time TE1. For example, the echo time TE1 is set to be 30 msec, and the echo time TE2 is set to be 60 msec.

In order to acquire MR signals with the further emphasized hydrogen atomic nuclear density PD and transverse relaxation time T2, a variable echo method for changing an echo time is used. For example, the echo time TE1 is set to be 20 msec, and the echo time TE2 is set to be 120 msec.

FIG. 2 shows an echo signal acquisition pulse sequence using a gradient field echo (FE) method. When a short echo time is set, an MR signal with the emphasized hydrogen atomic nuclear density PD can be acquired. The difference between the gradient FE method and the pulse echo method is that an inverted read gradient field is applied in place of 180° pulses so as to converge the spin phase.

When the pulse sequence is executed using the gradient FE method and the pulse echo method, MR signals with the emphasized hydrogen atomic nuclear density PD and transverse relaxation time T2 can be obtained. However, it is difficult to acquire an MR signal with the emphasized longitudinal relaxation time T1.

In this manner, when the pulse sequence is executed once by the conventional method, MR images in which two out of three parameters, i.e., the hydrogen atomic nuclear density PD, the longitudinal relaxation time T1, and the transverse relaxation time T2 are respectively emphasized can be acquired. However, MR images in which the three parameters are respectively emphasized cannot be obtained. Therefore, in order to acquire MR images in which the three parameters are respectively emphasized, at least two pulse sequences must be executed.

Thus, a demand has arisen for the MRI apparatus capable of acquiring MR images in which the hydrogen atomic nuclear density PD, the longitudinal relaxation time T1, and the transverse relaxation time T2 are respectively emphasized in a single sequence.

SUMMARY OF THE INVENTION

It is an object of the present invention to provide a method and system for controlling magnetic resonance signal acquisition sequence.

According to one aspect of the present invention, there is provided a method for controlling magnetic resonance signal acquisition sequence, the method comprising the steps of:

applying a first magnetic resonance excitation pulse;

applying a first inversion pulse after a first period from application of the first magnetic resonance excitation pulse;

detecting a first magnetic resonance signal by providing encoding data after a second period from application of the first magnetic resonance excitation pulse;

applying a second inversion pulse after a third period from application of the first magnetic resonance excitation pulse;

detecting a second magnetic resonance signal by providing the encoding data after a fourth period from application of the first magnetic resonance excitation pulse;

applying a second magnetic resonance excitation pulse after a fifth period from detection of the second magnetic resonance signal;

applying a third inversion pulse after a sixth period from the application of the second magnetic resonance excitation pulse; and detecting a third magnetic resonance signal by providing the encoding data after a seventh period from the application of the second magnetic resonance excitation pulse.

According to another aspect of the present invention, there is provided a system for controlling magnetic resonance signal acquisition sequence, the system comprising:

static field applying means for applying a static field to a subject;

gradient field applying means for applying gradient fields to the subject;

RF pulse applying means for applying an RF pulse to the subject; and controlling means for controlling the static field applying means, the gradient field applying means and the RF pulse applying means, wherein the controlling means includes:

means for applying a first magnetic resonance excitation pulse;

means for applying a first inversion pulse after a first period from application of the first magnetic resonance excitation pulse;

means for detecting a first magnetic resonance signal by providing encoding data after a second period from application of the first magnetic resonance excitation pulse;

means for applying a second inversion pulse after a third period from application of the first magnetic resonance excitation pulse;

means for detecting a second magnetic resonance signal by providing the encoding data after a fourth period from application of the first magnetic resonance excitation pulse;

means for applying a second magnetic resonance excitation pulse after a fifth period from detection of the second magnetic resonance signal;

means for applying a third inversion pulse after a sixth period from the application of the second magnetic resonance excitation pulse; and means for detecting a third magnetic resonance signal by providing the encoding data after a seventh period from the application of the second magnetic resonance excitation pulse.

BRIEF DESCRIPTION OF THE DRAWINGS

FIG. 1 shows a pulse sequence by a multi-echo method;

FIG. 2 shows a pulse sequence by a gradient FE method;

DETAILED DESCRIPTION OF THE PREFERRED EMBODIMENTS

An embodiment of the present invention will be described below with reference to the accompanying drawings.

Figure 3:
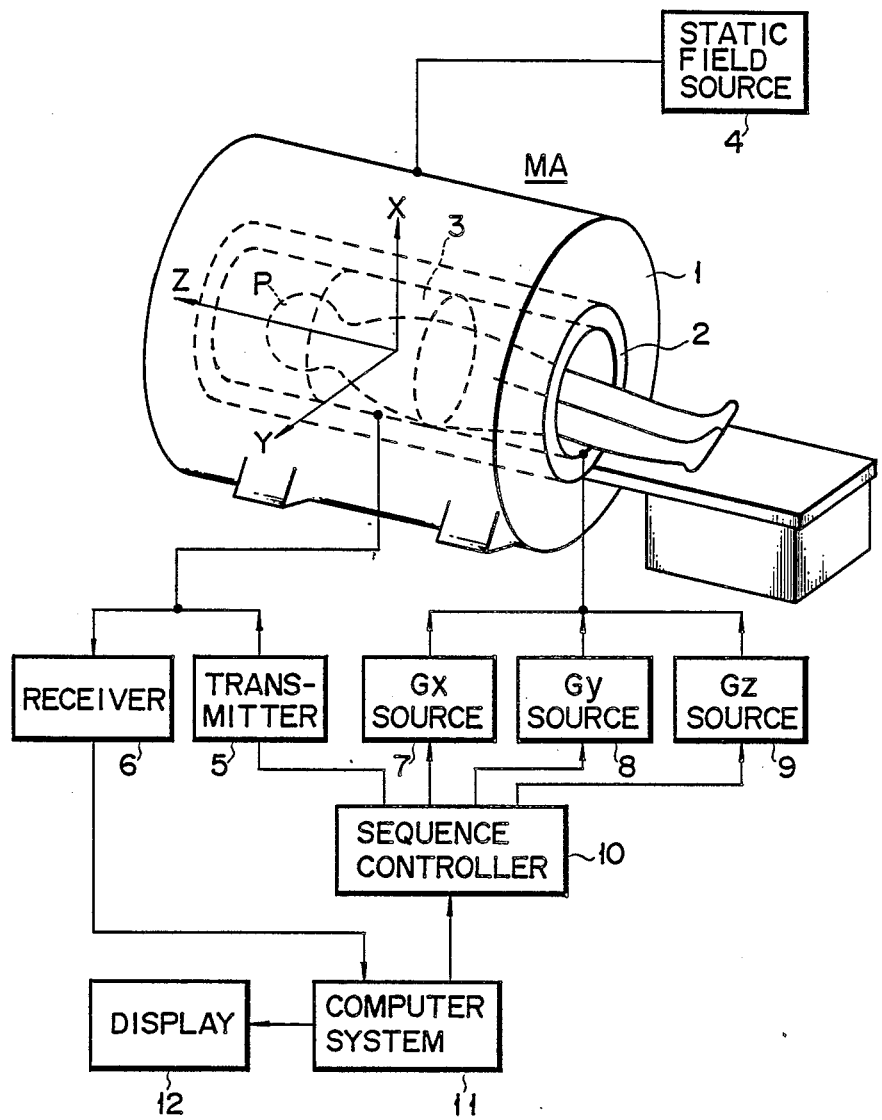
FIG. 3 is a block diagram showing an arrangement of an MRI system.

In an MRI apparatus shown in FIG. 3, a magnet assembly MA has a static field coil 1 for generating a static field, a gradient field coil 2 for generating gradient fields in the X-, Y-, and Z-axis directions, and a transmission/reception coil 3. Note that a subject P is placed in a field generating region in the magnet assembly MA.

The static field coil 1 generates a static field by a static field source 4. The transmission/reception coil 3 generates RF pulses such as a 90°–180° pulse series, or the like by a transmitter 5, and detects MR signals from the subject P by a receiver 6. The gradient field coil 2 generates gradient fields by an X-axis gradient field (Gx) source 7, a Y-axis gradient field (Gy) source 8, and a Z-axis gradient field (Gz) source 9, respectively.

The sources 7, 8, and 9, and the transmitter 5 are driven by a sequence controller 10 in accordance with a predetermined pulse sequence.

A computer system 11 controls the sequence controller 10. The computer system 11 performs signal processing of MR signals output from the receiver 6, and reconstructs a tomographic image of a predetermined slice portion. The tomographic image is displayed on a display 12.

The pulse sequence of this embodiment will be described below.

Figure 4:
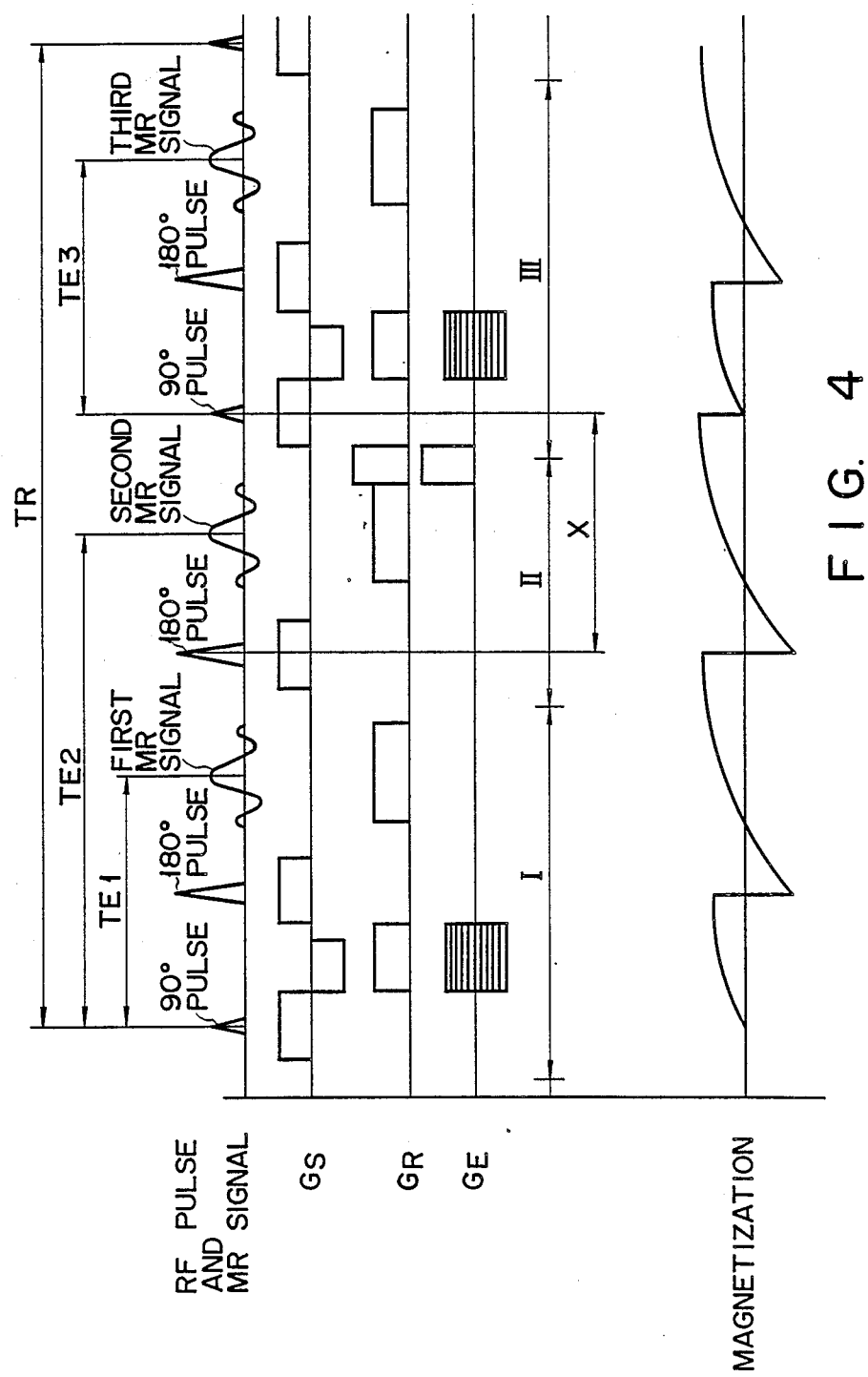
FIG. 4 shows a pulse sequence according to an embodiment of the present invention.

As shown in FIG. 4, in periods I and II, first and second MR signals are acquired in the pulse sequence by the multi-echo method based on a 90°–180° pulse series spin echo method. This method will be referred to as a Long SE multi-echo method. In a period III, a pulse sequence based on the 90°–180° pulse series spin echo method is executed using an encoding amount (the same encoding amount as the strength of an encoding gradient field $G_E$) in the periods I and II, thus acquiring a third MR signal. This method will be referred to as a Short SE scheme hereinafter.

In this pulse sequence, one encoding process is constituted by combining the above-mentioned Long SE multi-echo method and the Short SE method. In the Long SE multi-echo method, if $TR > T1$ and $TE1 < T2$, a first MR signal with the emphasized hydrogen atomic nuclear density PD can be acquired. If $TR > T1$ and $TE2 > T2$, a second MR signal with the emphasized transverse relaxation time T2 can be acquired. In the Short SE method, a duration X between the 180° pulse in the period II and the 90° pulse in the period III is set to be about 200 msec, and $TR < T1$ and $TE3 < T2$, so that a third MR signal with the emphasized longitudinal relaxation time T1 can be acquired. An MR signal strength S is given by:

$$S \propto \rho \cdot \exp(-TE/T2)(1 - \exp(-TR/T1))$$

where $\rho$ is the spin density.

That is, when TE and TR are respectively changed, MR images in which T1, T2, and PD are respectively emphasized can be reconstructed.

When an MR image having 256×256 matrixes is acquired, 256 encoding processes are performed. With the above-mentioned pulse sequence, three MR images respectively having emphasized T1, T2, and PD can be acquired within a short period as compared with a conventional method.

Figure 5:
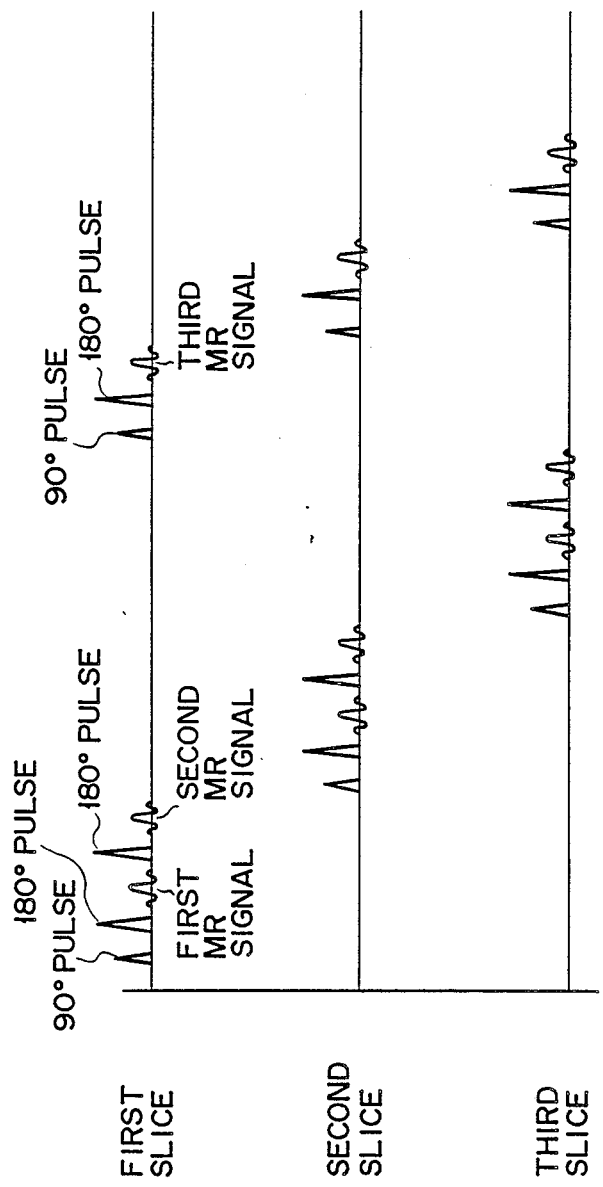
FIG. 5 shows a pulse sequence in a multi-slice.

A multi-slice process is executed by the pulse sequence shown in FIG. 5.

Another embodiment of a pulse sequence will be described below.

Figure 6:
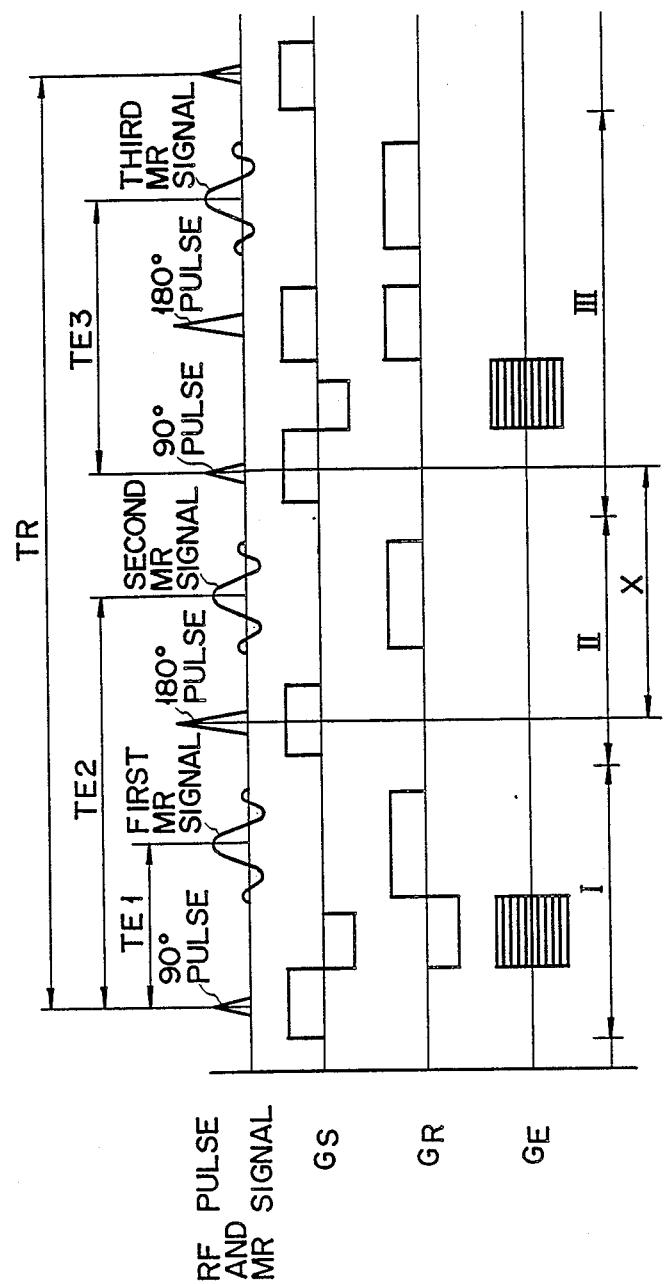
FIG. 6 shows a pulse sequence according to another embodiment of the present invention.

As shown in FIG. 6, a first MR signal is acquired in a period I by a gradient FE method. In this case, since a spin recovery time can be shortened upon acquisition of a second MR signal, a third MR signal with emphasized T1 can be acquired like in an inversion recovery (IR) method.

Note that the third MR signal can be acquired in the period III by the gradient FE method. In the period I, the first MR signal can be acquired by a hybrid echo (HE) method.

The HE method is described in U.S. patent application Ser. No. 354,762, "Magnetic resonance imaging system and method", Kazuto NAKABAYASHI and Masatoshi HANAWA. As compared with a conventional SE method, a 180° pulse is applied earlier by a time corresponding to one chemical shift cycle. By extension of an acquisition time of an MR signal, an S/N ratio can be improved to about $\sqrt{2}$ times.

Figure 7:
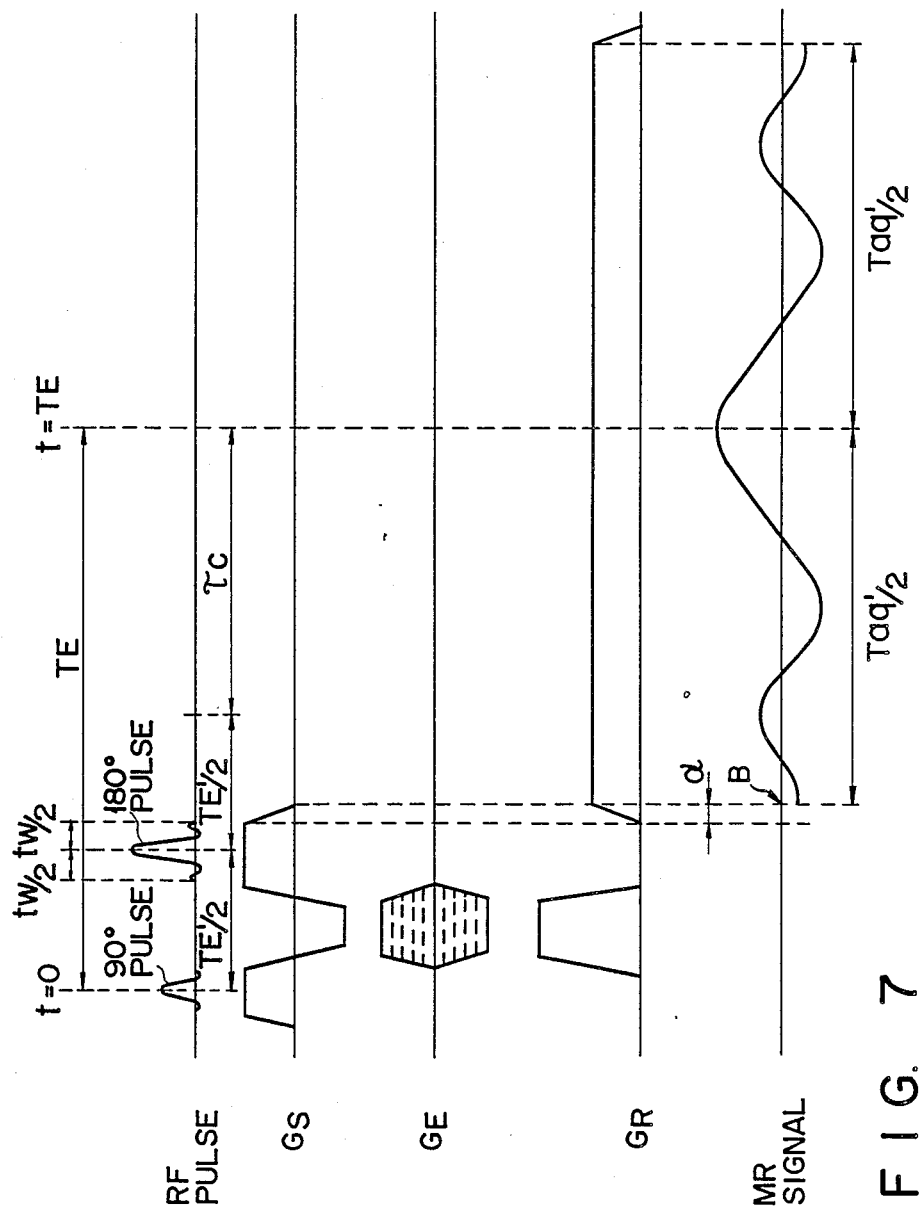
FIG. 7 shows a pulse sequence by a hybrid echo method.

As shown in FIG. 7, when an application time of a 90° pulse is $t=0$ in the HE method, an application time of a 180° pulse is set to be $t=TE'/2$. An MR signal acquisition time Taq' is set to satisfy Taq'>TE−tW−2α. As can be seen from FIG. 7, TE'=TE−τc. Note that TE is the echo time for a proton, τc is a cycle for which phases of proton and fat spins coincide with each other and which is obtained by a chemical shift amount between the proton and fat, and α is the rise time of $G_S$ and $G_R$. Thus, a long MR signal acquisition time Taq' can be set.

A spin causing frequency drift with respect to a proton due to a chemical shift of fat coincides in phase at a peak of an MR signal.

Furthermore, a spin causing frequency drift occurred by a factor other than the chemical shift of fat can be caused not to coincide in phase at a peak of an MR signal.

Therefore, since the time Taq' can be set to exceed a limit of Taq≦TE−tW−2α (Taq is the MR signal acquisition time in the conventional SE method), an S/N ratio can be improved if the resolution and the echo time remain the same. If the echo time remains the same, the same contrast as in the conventional method can be obtained. Against portions having different magnetic susceptibility, a contrast can be improved.

The HE method will be described in detail below.

(1) A resonance frequency of a proton (water) with respect to a static field of the MRI apparatus is obtained.

(2) A cycle τc for which water and fat spin phases coincide with each other is obtained by a chemical shift amount (3.3 to 3.6 ppm) between water and fat with respect to the resonance frequency.

τc(sec) = 1/[water resonance frequency (Hz) · water-fat chemical shift amount (ppm)]

(3) TE−τc=TE' is set for a predetermined echo time TE.

(4) 90° and 180° pulse application times are set so that the centers of 90° and 180° pulse waves coincide with t=0 and t=TE'/2, respectively.

(5) The earliest MR signal acquisition time is a time B immediately after application of a 180° pulse. For example, an MR signal can be acquired within Taq' to have the peak time (t=TE) of the MR signal as the center.

(6) Application times of a slice gradient field $G_S$, a read gradient field $G_R$, and a phase encoding gradient field $G_E$ are controlled by a normal spin echo sequence. Note that the strength of the read gradient field $G_R$ is set so that the peak time of the MR signal appears at t=TE'+τc, i.e., t=TE, and a predetermined resolution can be obtained with respect to Taq'.

In comparison with a pulse sequence by the conventional SE method, an MR signal obtained by the pulse sequence of the HE method tends to be influenced by inhomogeneity of a static field. Therefore, an MRI apparatus having a static field magnet system for generating a static field with a high homogeneity is necessary. For example, if a static field is 0.5T, inhomogeneity in a field generating region having a diameter=250 mm is preferably suppressed to several ppm.

As described above, in the pulse sequence of the HE method, if the above condition (2) is satisfied, i.e., if τc (sec)=1/[water resonance frequency (Hz)·water-fat chemical shift amount (ppm)] is satisfied, an MR image having the same contrast as that obtained by the conventional method can be acquired. If the resolution of an MR image remains the same, a noise component in an MR image is reduced by $1/\sqrt{}/(Taq'/Taq_i)$, thus improving an S/N ratio.

The above-mentioned processing by the HE method is executed in the period I. When the HE method is employed, application of a second 180° pulse and a pulse sequence in a period III can be executed earlier than in the conventional sequence.

The embodiments of the present invention have been described. However, the present invention is not limited to the above embodiments, and various changes and modifications may be made within the spirit and scope of the invention.

What is claimed is:

1. A method for controlling magnetic resonance signal acquisition sequence, the method comprising the steps of:
    applying a first magnetic resonance excitation pulse;
    applying a first inversion pulse after a first period from application of the first magnetic resonance excitation pulse;
    detecting a first magnetic resonance signal by providing encoding data after a second period from application of the first magnetic resonance excitation pulse;
    applying a second inversion pulse after a third period from application of the first magnetic resonance excitation pulse;
    detecting a second magnetic resonance signal by providing the encoding data after a fourth period from application of the first magnetic resonance excitation pulse;
    applying a second magnetic resonance excitation pulse after a fifth period from detection of the second magnetic resonance signal;
    applying a third inversion pulse after a sixth period from the application of the second magnetic resonance excitation pulse; and
    detecting a third magnetic resonance signal by providing the encoding data after a seventh period from the application of the second magnetic resonance excitation pulse.

2. The method according to claim 1, wherein the first inversion pulse includes a gradient field for reading magnetic resonance signals.

3. A system for controlling magnetic resonance signal acquisition sequence, the system comprising:
    means for applying a first magnetic resonance excitation pulse;
    means for applying a first inversion pulse after a first period from application of the first magnetic resonance excitation pulse;
    means for detecting a first magnetic resonance signal by providing encoding data after a second period from application of the first magnetic resonance excitation pulse;
    means for applying a second inversion pulse after a third period from application of the first magnetic resonance excitation pulse;
    means for detecting a second magnetic resonance signal by providing the encoding data after a fourth period from application of the first magnetic resonance excitation pulse;
    means for applying a second magnetic resonance excitation pulse after a fifth period from detection of the second magnetic resonance signal;
    means for applying a third inversion pulse after a sixth period from the application of the second magnetic resonance excitation pulse; and means for detecting a third magnetic resonance signal by providing the encoding data after a seventh period from the application of the second magnetic resonance excitation pulse.

4. The system according to claim 3, wherein the first inversion pulse includes a gradient field for reading magnetic resonance signals.

5. A system for controlling magnetic resonance signal acquisition sequence, the system comprising:

静 static field applying means for applying a static field to a subject;

gradient field applying means for applying gradient fields to the subject;

RF pulse applying means for applying an RF pulse to the subject; and controlling means for controlling the static field applying means, the gradient field applying means and the RF pulse applying means, wherein the controlling means includes:

means for applying a first magnetic resonance excitation pulse;

means for applying a first inversion pulse after a first period from application of the first magnetic resonance excitation pulse; means for detecting a first magnetic resonance signal by providing encoding data after a second period from application of the first magnetic resonance excitation pulse;

means for applying a second inversion pulse after a third period from application of the first magnetic resonance excitation pulse;

means for detecting a second magnetic resonance signal by providing the encoding data after a fourth period from application of the first magnetic resonance excitation pulse;

means for applying a second magnetic resonance excitation pulse after a fifth period from detection of the second magnetic resonance signal;

means for applying a third inversion pulse after a sixth period from the application of the second magnetic resonance excitation pulse; and means for detecting a third magnetic resonance signal by providing the encoding data after a seventh period from the application of the second magnetic resonance excitation pulse.

6. The system according to claim 5, wherein the first inversion pulse includes a gradient field for reading magnetic resonance signals.

7. The system according to claim 5, wherein the gradient field applying means includes:

first field generating means for generating a first gradient field for selecting a slice of the subject to be excited;

second field generating means for generating a second gradient field for encoding phases; and third field generating means for generating a third gradient field for reading magnetic resonance signals.

* * * * *